(12) United States Patent
Baragona et al.

(10) Patent No.: US 9,155,172 B2
(45) Date of Patent: Oct. 6, 2015

(54) LOAD CONTROL DEVICE HAVING AN ELECTRICALLY ISOLATED ANTENNA

(75) Inventors: Robert Baragona, Conshohocken, PA (US); Matthew Robert Blakeley, Macungie, PA (US); Robert Bollinger, Jr., Fogelsville, PA (US); Orbay Tuncay, Allentown, PA (US)

(73) Assignee: LUTRON ELECTRONICS CO., INC., Coopersburg, PA (US)

( * ) Notice: Subject to any disclaimer, the term of this patent is extended or adjusted under 35 U.S.C. 154(b) by 659 days.

(21) Appl. No.: 13/468,914

(22) Filed: May 10, 2012

(65) Prior Publication Data

US 2012/0313456 A1    Dec. 13, 2012

Related U.S. Application Data

(60) Provisional application No. 61/485,962, filed on May 13, 2011.

(51) Int. Cl.
| | |
|---|---|
| *H02H 11/00* | (2006.01) |
| *H05B 37/02* | (2006.01) |
| *H01Q 1/00* | (2006.01) |
| *H01Q 1/22* | (2006.01) |
| *H05K 1/02* | (2006.01) |
| *H05K 1/16* | (2006.01) |

(52) U.S. Cl.
CPC ........... *H05B 37/0272* (2013.01); *H01Q 1/002* (2013.01); *H01Q 1/007* (2013.01); *H01Q 1/2216* (2013.01); *H05K 1/0239* (2013.01); *H05K 1/162* (2013.01)

(58) Field of Classification Search
CPC . H05B 37/0272; H01Q 1/2216; H01Q 1/002; H01Q 1/007; H05K 1/0239; H05K 1/162
USPC .......................................................... 307/326
See application file for complete search history.

(56) References Cited

U.S. PATENT DOCUMENTS

| | | | |
|---|---|---|---|
| 5,239,205 A | 8/1993 | Hoffman et al. | |
| 5,466,892 A * | 11/1995 | Howard et al. | 174/261 |
| 5,736,965 A | 4/1998 | Mosebrook et al. | |
| 5,905,442 A | 5/1999 | Mosebrook et al. | |
| 5,982,103 A | 11/1999 | Mosebrook et al. | |
| 6,144,346 A | 11/2000 | Boy | |

(Continued)

FOREIGN PATENT DOCUMENTS

| | | |
|---|---|---|
| CN | 1684090 A | 10/2005 |
| CN | 1754283 A | 3/2006 |

(Continued)

*Primary Examiner* — Jared Fureman
*Assistant Examiner* — Esayas Yeshaw
(74) *Attorney, Agent, or Firm* — Condo Roccia Koptiw LLP

(57) ABSTRACT

A load control device for controlling the power delivered from a power source to an electrical load includes an antenna and a communication circuit to receive and transmit messages via radio frequency (RF) signals. The communication circuit is coupled to the power source but is capacitively coupled to the antenna. The capacitive coupling is formed through multiple layers of a printed circuit board (PCB) in which each layer includes a conductive trace that neighbors another conductive trace on an adjacent layer. The capacitive coupling provides that the antenna is electrically isolated from the communication circuit which accordingly, provides that the antenna is electrically isolated from the power source.

18 Claims, 5 Drawing Sheets

(56) References Cited

U.S. PATENT DOCUMENTS

| | | |
|---|---|---|
| 6,515,555 B2 * | 2/2003 | Leddige et al. ............... 333/34 |
| 6,818,838 B1 * | 11/2004 | Jochym et al. ............... 174/261 |
| 7,000,837 B2 | 2/2006 | Akiho et al. |
| 7,106,261 B2 | 9/2006 | Nagel et al. |
| 7,362,285 B2 | 4/2008 | Webb et al. |
| 7,408,525 B2 | 8/2008 | Webb et al. |
| 7,548,216 B2 | 6/2009 | Webb et al. |
| 7,573,436 B2 | 8/2009 | Webb et al. |
| 7,592,967 B2 | 9/2009 | Mosebrook et al. |
| 7,714,790 B1 * | 5/2010 | Feldstein et al. ............... 343/702 |
| 7,834,817 B2 | 11/2010 | Mosebrook et al. |
| 8,471,779 B2 | 6/2013 | Mosebrook |
| 2004/0125040 A1 | 7/2004 | Ferguson et al. |
| 2005/0040997 A1 | 2/2005 | Akiho et al. |
| 2005/0136747 A1 | 6/2005 | Caveney et al. |
| 2006/0028384 A1 | 2/2006 | Akiho et al. |
| 2009/0180290 A1 * | 7/2009 | Grajcar ............... 362/373 |
| 2009/0303135 A1 | 12/2009 | Reed et al. |
| 2010/0052574 A1 * | 3/2010 | Blakeley et al. ............... 315/307 |
| 2010/0156749 A1 | 6/2010 | Kim et al. |

FOREIGN PATENT DOCUMENTS

| | | |
|---|---|---|
| CN | 1906816 A | 1/2007 |
| CN | 101626115 A | 1/2010 |
| WO | WO 2006133153 A1 * | 12/2006 |

* cited by examiner

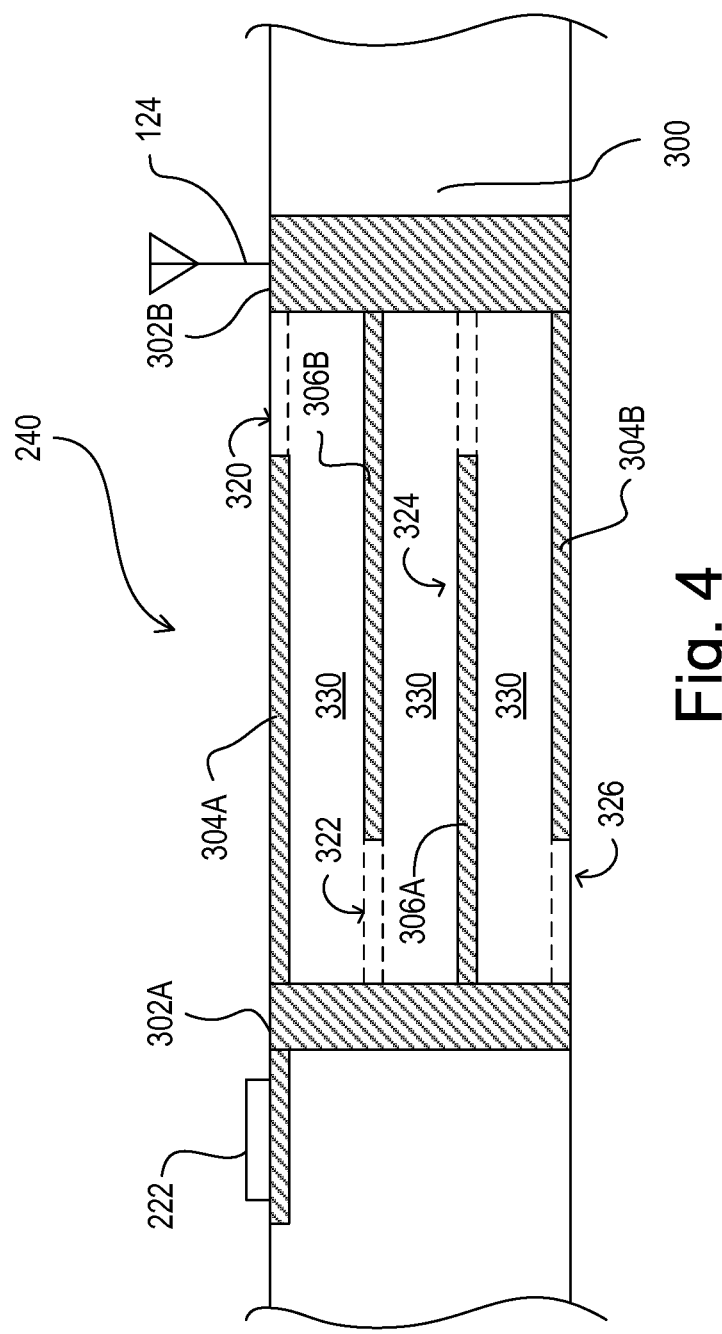

LOAD CONTROL DEVICE HAVING AN ELECTRICALLY ISOLATED ANTENNA

CROSS-REFERENCE TO RELATED APPLICATIONS

This application is a non-provisional application of commonly-assigned U.S. Provisional Application No. 61/485,962, filed May 13, 2011, entitled LOAD CONTROL DEVICE HAVING AN ISOLATED ANTENNA, the entire disclosure of which is hereby incorporated by reference.

BACKGROUND OF THE INVENTION

1. Field of the Invention

The present invention relates to a load control device for control of the amount of power delivered from an alternating-current (AC) power source to an electrical load, and more particularly, to a load control device having a radio-frequency (RF) communication circuit to receive RF messages wherein the communication circuit includes an antenna which is electrically isolated from the AC power source.

2. Description of the Related Art

Typical load control devices are operable to control the amount of power delivered to an electrical load, such as a lighting load or a motor load, from an alternating-current (AC) power source. Many of these load control devices comprise communication circuits for receiving or transmitting digital messages via a communication link. Such communication links may be wired or wireless (e.g., radio frequency, infrared, etc). In order to receive or transmit digital messages via a wireless radio-frequency (RF) communication link, a load control device requires an antenna. Some antennas may reside fully within an enclosure of the load control device, whereas other antennas may extend fully or partially outside the enclosure. Because load control devices are coupled to the AC power source, an antenna extending outside the enclosure of a load control device should be electrically isolated from the AC power source for safety reasons. The use of isolation transformers or optocouplers are well known techniques that can be used to electrically isolate the AC power source from other elements of a load control device, however such prior art isolation techniques can be costly. Therefore, there exists a need for a load control device having an antenna which is electrically isolated—in a low cost manner—from the AC power source.

SUMMARY OF THE INVENTION

According to an embodiment of the present invention, a load control device is operable to control the amount of power delivered to a load from an AC power source. The load control device includes a printed circuit board that has a first layer comprising a first trace and a second layer comprising a second trace. The first and second traces being positioned parallel to one another. The load control device includes an enclosure that contains the printed circuit board. The load control device also includes a communication circuit that is electrically coupled to the first trace; and a wire monopole antenna that is electrically coupled to the second trace. The wire monopole antenna is adjustable into one or more positions. A first position of the one or more positions includes the wire monopole antenna extending freely from the enclosure. The first position increases a range of reception of the wire monopole antenna relative to the wire monopole antenna not extending freely from the enclosure. The first trace is oriented to form a capacitive coupling with respect to the second trace, such that the antenna is capacitively coupled to the communication circuit.

According to another embodiment of the present invention, a message receiving structure can be used in a load control device. The load control device has an enclosure containing the printed circuit board. The message receiving structure includes a printed circuit board having a first layer comprising a first trace, a second layer comprising a second trace, a third layer comprising a third trace, and a fourth layer comprising a fourth trace. The first, second, third, and fourth traces are positioned parallel to one another. The second trace is positioned between the first and third traces, and the third trace is positioned between the second and fourth traces. The message receiving structure includes a communication circuit that is electrically coupled to the first and third traces; and a wire monopole antenna electrically coupled to the second and fourth traces. The first and third traces are oriented to form a capacitive coupling with respect to the second and fourth traces, such that the antenna is capacitively coupled to the communication circuit. The wire monopole antenna is adjustable into one or more positions. A first position of the one or more positions includes the wire monopole antenna extending freely from the enclosure. The first position increases a range of reception of the wire monopole antenna relative to the wire monopole antenna not extending freely from the enclosure.

Other features and advantages of the present invention will become apparent from the following description of the invention that refers to the accompanying drawings.

BRIEF DESCRIPTION OF THE DRAWINGS

FIG. 4 is a simplified cross-sectional view of a printed circuit board (PCB) of the load control device of FIG. 1.

DETAILED DESCRIPTION OF THE INVENTION

Figure 1:
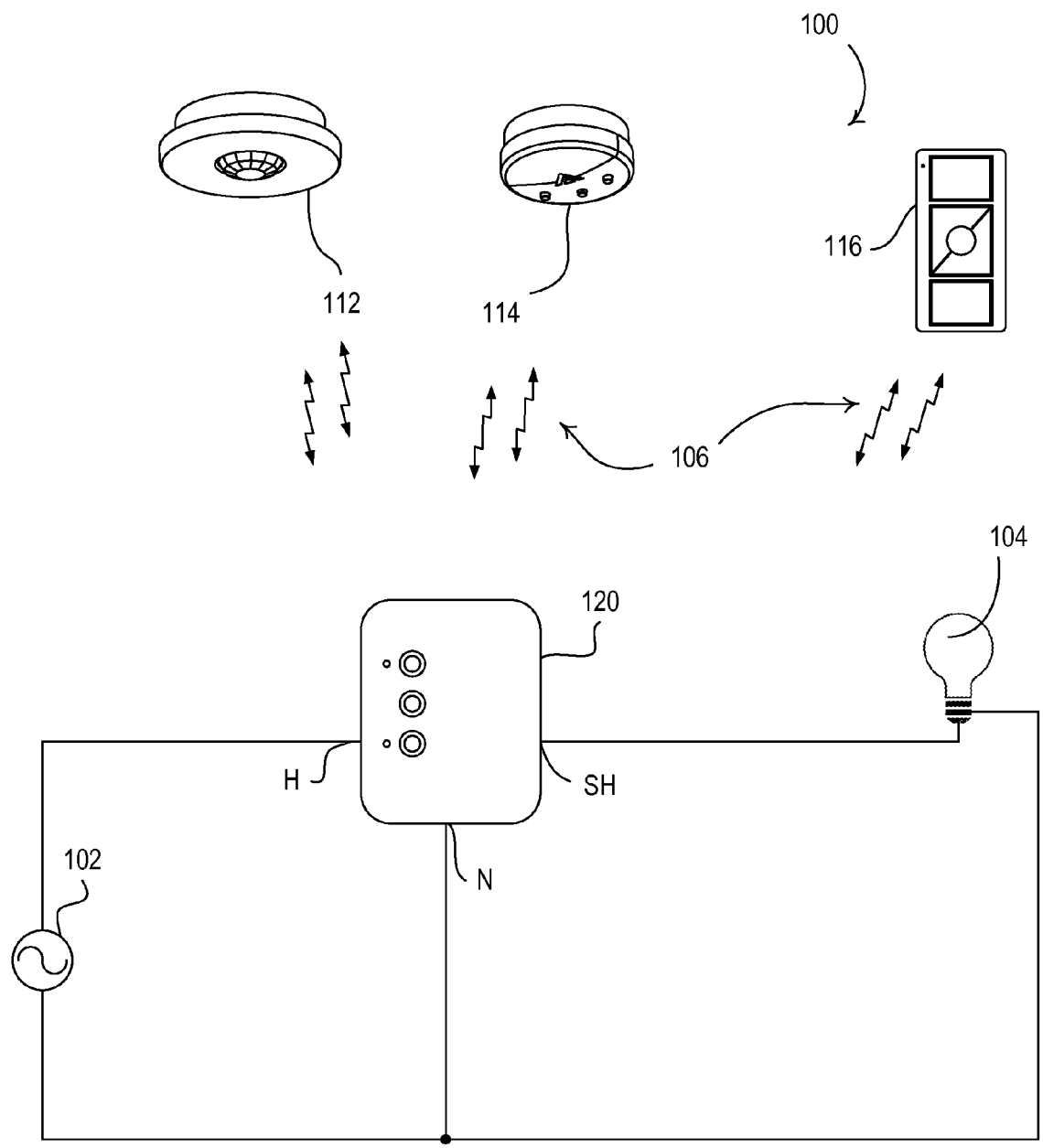
FIG. 1 is a simplified diagram of a radio-frequency (RF) lighting control system including a load control device according to an embodiment of the invention.

The foregoing summary, as well as the following detailed description of the preferred embodiments, is better understood when read in conjunction with the appended drawings. For the purposes of illustrating the invention, there is shown in the drawings an embodiment that is presently preferred, in which like numerals represent similar parts throughout the several views of the drawings, it being understood, however, that the invention is not limited to the specific methods and instrumentalities disclosed.

FIG. 1 is a simplified block diagram of a load control system 100 that may be installed in a building, such as a residence or a commercial space. The load control system 100 comprises a load control device 120 which is coupled to an alternating current (AC) power source 102 via hot (H) and neutral (N) terminals and is operable to control the power delivered to a lighting load 104 via a switched hot (SH) terminal. The load control device 120 may be operable to switch (i.e., turn on and off) the power delivered to the lighting load 104. Alternatively, the load control device 120 may be operable to dim the intensity of the lighting load 104 using a phase control dimming technique. Further, the load control device 120 may comprise multiple switched hot terminals such that it can control multiple lighting loads independently. The load control device 120 is operable to at least receive digital messages via wireless signals, e.g., radio-frequency (RF) signals 106 (i.e., an RF communication link). In particular, the load control device 120 is operable to control the lighting load 104 in response to the digital messages received via the RF signals 106. The load control device 120 may also be operable to transmit digital messages via the RF signals 106.

The load control system 100 further comprises a wireless occupancy sensor 112, a wireless daylight sensor 114, and a remote control 116. The wireless occupancy sensor 112 is operable to detect an occupancy condition (presence of an occupant) or a vacancy condition (absence of an occupant) in the space in which the occupancy sensor is mounted. The occupancy sensor 112 is operable to wirelessly transmit digital messages via the RF signals 106 to the load control device 120 in response to detecting the occupancy condition or the vacancy condition in the space. For example, in response to detecting an occupancy condition in the space, the occupancy sensor 112 may transmit a digital message to the load control device 120 to cause the load control device to turn on the lighting load 104, and in response to detecting a vacancy condition in the space, transmit a digital message to the load control device to cause the load control device to turn off the lighting load.

The daylight sensor 114 is operable to measure an ambient light intensity in the space in which the daylight sensor is mounted. The daylight sensor 114 wirelessly transmits digital messages via the RF signals 106 to the load control device 120. For example, the daylight sensor 114 may transmit a digital message to the load control device 120 to cause the load control device to turn on the lighting load 104 if the ambient light intensity detected by the daylight sensor 114 is less than a setpoint light intensity, and to turn off the lighting load if the ambient light intensity is greater than the setpoint light intensity.

The remote control 116 comprises a plurality of actuators to provide for control of the lighting load 104 by a user from a remote location. In response to an actuation of one of the actuators, the remote control 116 wirelessly transmits digital messages via the RF signals 106 to the load control device 120. For example, the remote control 116 may transmit a digital message to the load control device 120 to turn on or off the lighting load 104 in response to a user pressing an on or off actuator, respectively.

The operation of the RF lighting control system 100 is described in greater detail in U.S. patent application Ser. No. 12/203,518, filed Sep. 3, 2008, entitled RADIO-FREQUENCY LIGHTING CONTROL SYSTEM WITH OCCUPANCY SENSING, and U.S. patent application Ser. No. 12/727,956, filed Mar. 19, 2010, entitled WIRELESS BATTERY-POWERED DAYLIGHT SENSOR, the entire disclosures of which are hereby incorporated by reference. Alternatively, the load control device 120 may be operable to control the lighting load 104 in response to digital messages received via RF signals 106 from other RF devices such as other dimmers, keypads, and/or controllers as described in U.S. Pat. No. 5,905,442, issued May 18, 1999, entitled METHOD AND APPARATUS FOR CONTROLLING AND DETERMINING THE STATUS OF ELECTRICAL DEVICES FROM REMOTE LOCATIONS, the entire disclosure of which is hereby incorporated by reference.

Figure 2A:
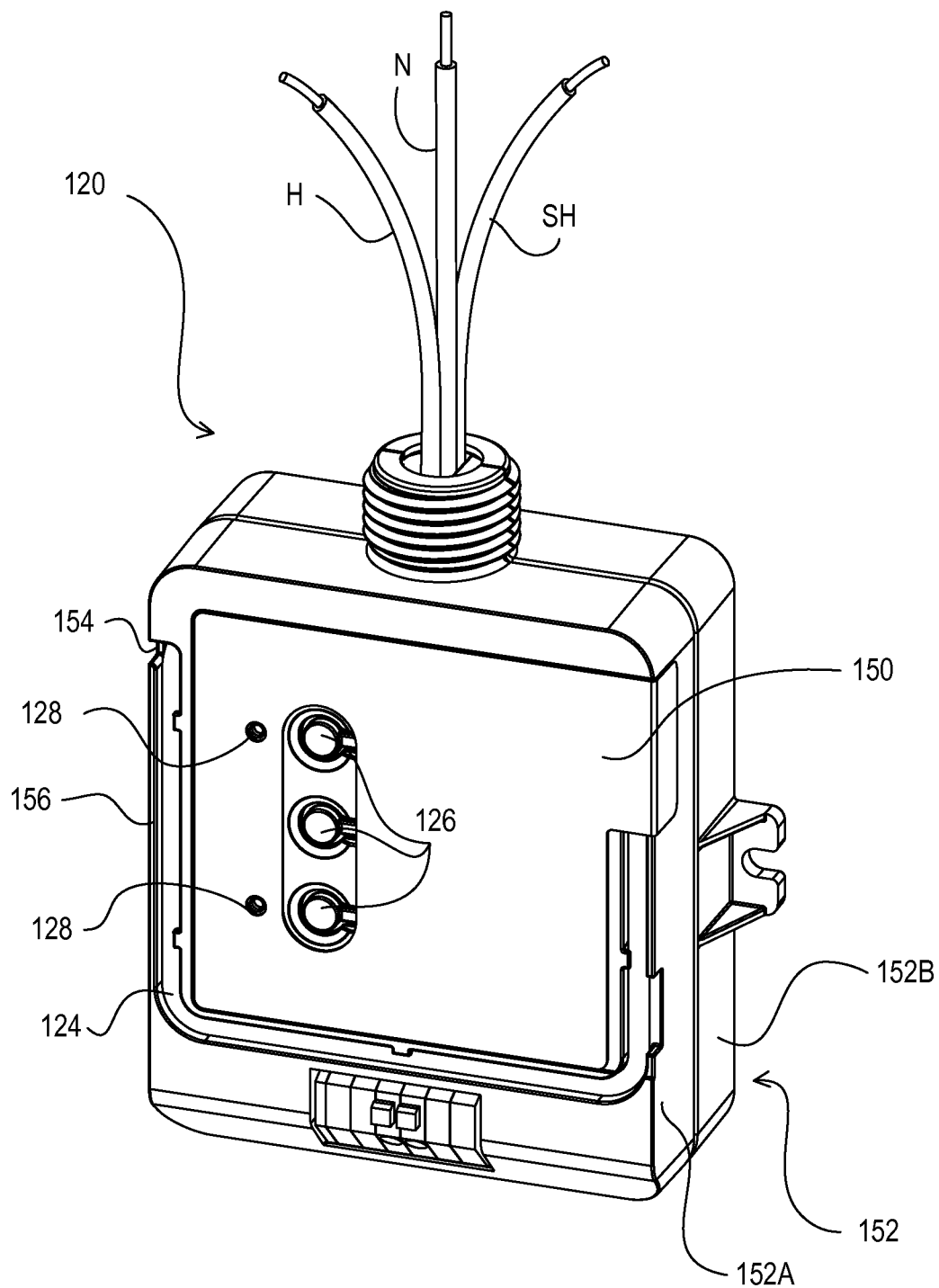
FIG. 2A is a perspective view of the load control device of FIG. 1.
Figure 2B:
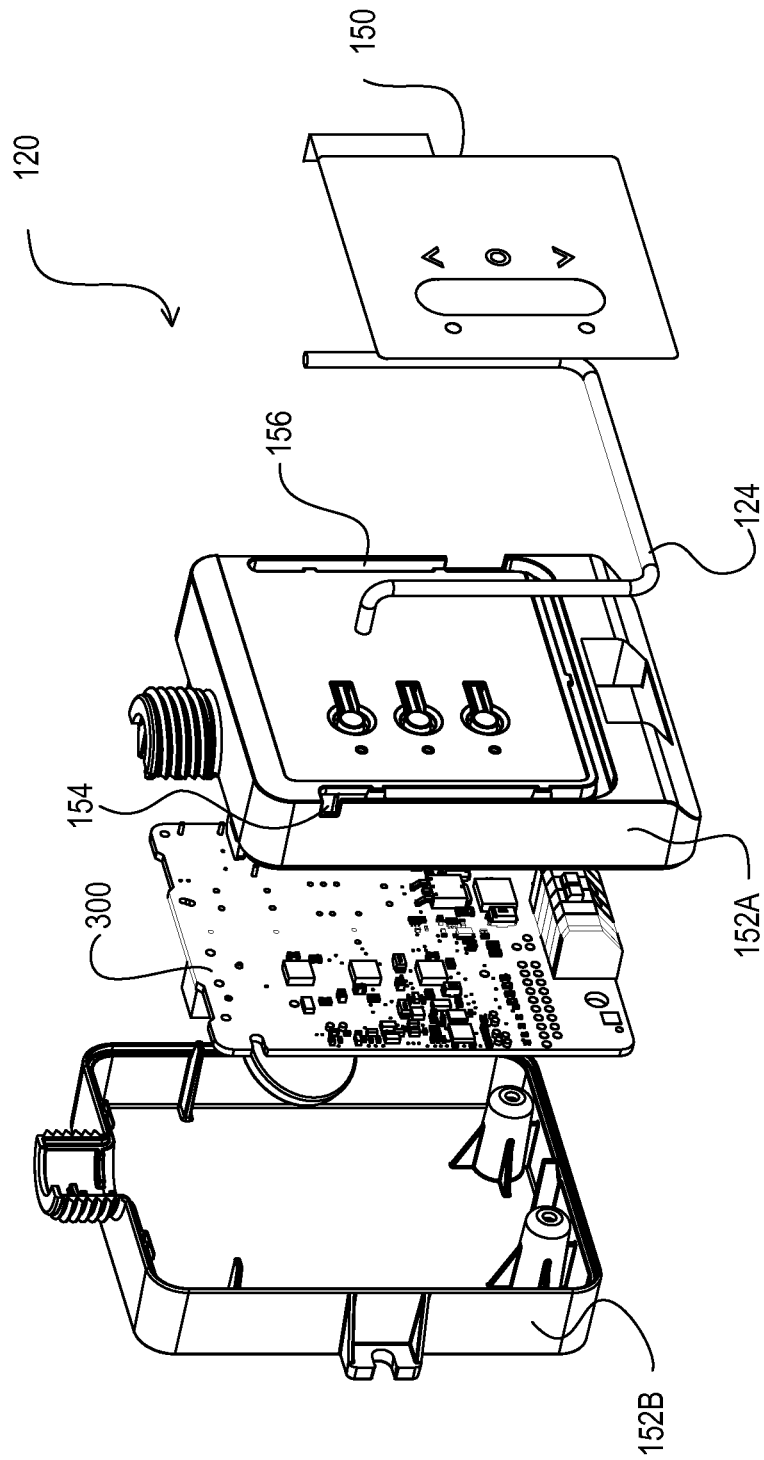
FIG. 2B is an exploded view of the load control device of FIG. 1.

FIG. 2A is a perspective view and FIG. 2B is an exploded view of the load control device 120. The load control device 120 is designed to be remotely mounted, for example, to an electrical junction box or in electrical closet or any other suitable wiring location. The load control device 120 comprises an enclosure 152 formed by a front enclosure portion 152A and a rear enclosure portion 152B which enclose a printed circuit board (PCB) 300. The load control device 120 further comprises a front cover 150 (e.g., a label) which attaches to the front enclosure portion 152A.

The load control device 120 further comprises actuators 126 and visual indicators 128. The actuators 126 are formed in the front enclosure portion 152A and are accessible through the front cover 150. The visual indicators 128 may, for example, comprise light emitting diodes (LEDs) mounted on the PCB 300 which are visible through the front enclosure portion 152A and the front cover 150. The actuators 126 are operable to cause the load control device 120 to control the lighting load 104 and the visual indicators 128 are operable to provide feedback of the status of the lighting load (e.g., to confirm that the load control device 120 has been properly wired after installation.) In addition, the actuators 126 can be used to program or commission the load control device 120 and the visual indicators 128 can provide feedback during programming. For example, the actuators 126 may be used to assign the occupancy sensor 112, the daylight sensor 114, and the remote control 116 to the load control device 120 such that the load control device will properly respond to the RF signals 106 transmitted by those devices.

The load control device 120 further comprises a wire monopole antenna 124 which is coupled to the PCB 300 and extends through an opening 154 in the front enclosure portion 152A. The antenna 124 provides for receipt and transmission of the RF signals 106. The antenna 124 may be received in a mechanical channel 156 formed in the front enclosure portion 152A, and then partially covered by the front cover 150. During the installation of the load control device 120, the front cover 150 of the load control device may be removed from the front enclosure portion 152A, and the antenna 124 may optionally be removed from the mechanical channel 156 such that the antenna 124 may extend freely from the enclosure. In certain installations, the range at which the load control device 120 can successfully receive the RF signals 106 from other control devices may improve when the antenna 124 extends freely.

Figure 3:
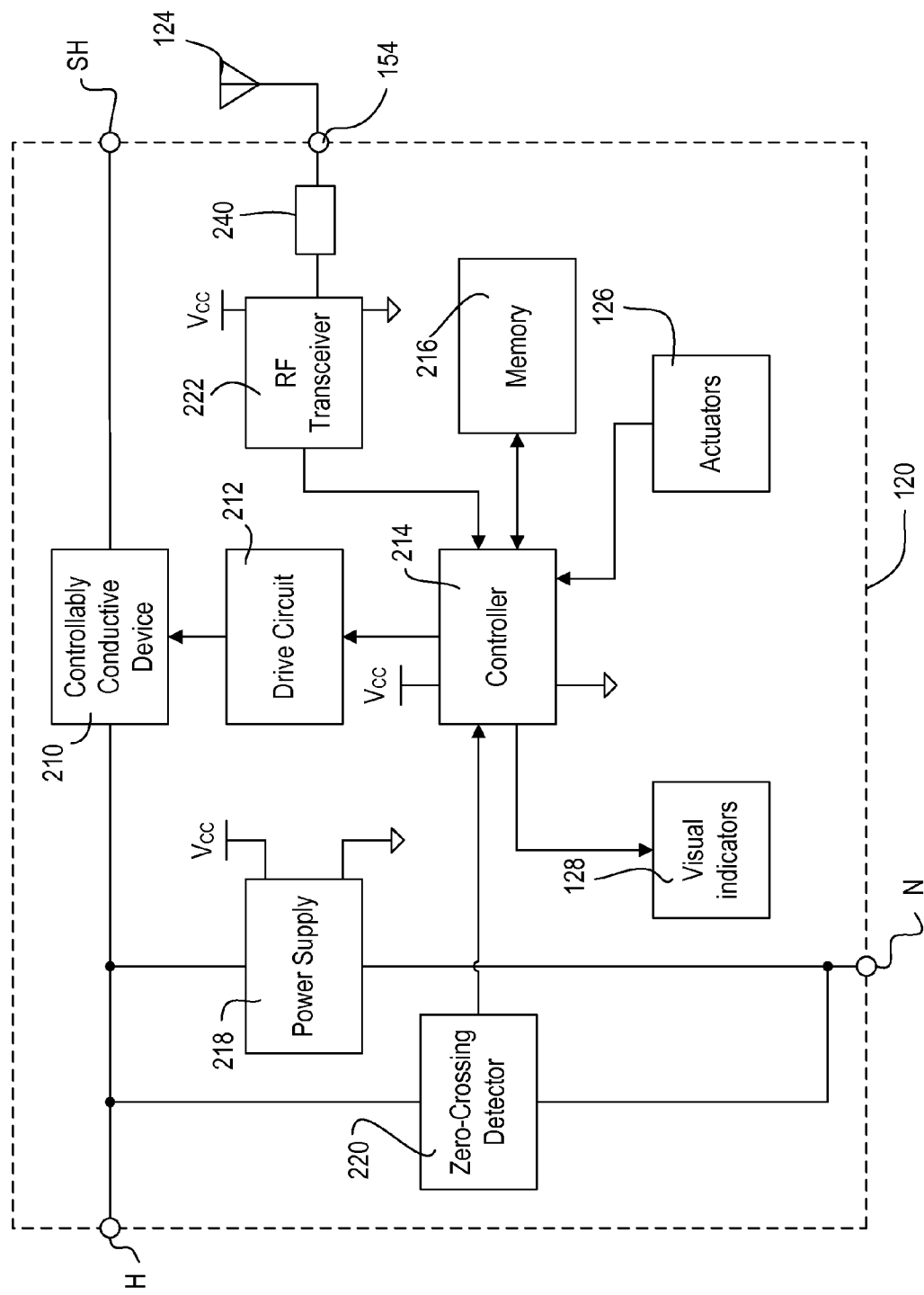
FIG. 3 is a simplified schematic diagram of the load control device of FIG. 1.

FIG. 3 is a simplified block diagram of the load control device 120. The load control device 120 comprises a controllably conductive device 210 coupled in series electrical connection between the AC power source 102 via the hot (H) terminal and the lighting load 104 via the switched hot (SH) terminal for control of the power delivered to the lighting load. The controllably conductive device 210 may comprise any suitable type of bidirectional semiconductor switch, such as, for example, a relay, a triac, a field-effect transistor (FET) in a rectifier bridge, or two FETs in anti-series connection. The controllably conductive device 210 includes a control input coupled to a drive circuit 212. The input to the control input will render the controllably conductive device 210 conductive or non-conductive, which in turn controls the amount of AC power supplied to the lighting load 104.

The drive circuit 212 provides control inputs to the controllably conductive device 210 in response to command signals from a controller 214. The controller 214 is preferably implemented as a microcontroller, but may be any suitable processing device, such as a programmable logic device (PLD), a microprocessor, or an application specific integrated circuit (ASIC). The controller 214 receives inputs from the actuators 126 and controls the visual indicators 128. The controller 214 is also coupled to a memory 216 for storage of the present state of the lighting load 104 and the serial number of the occupancy sensor 112, the daylight sensor 114, and the remote control 116 to which the load control device 120 is assigned. A power supply 218 generates a direct-current (DC) voltage $V_{CC}$ for powering the controller 214, the memory 216, and other low-voltage circuitry of the load control device 120. In particular, the power supply 218 is coupled to the AC power source 102 via the hot (H) and neutral (N) terminals and derives the DC voltage $V_{CC}$ from the AC power source.

A zero-crossing detector 220 determines the zero-crossings of the input AC waveform from the AC power source 102. A zero-crossing is defined as the time at which the AC supply voltage transitions from positive to negative polarity, or from negative to positive polarity, at the beginning of each half-cycle. The zero-crossing information is provided as an input to controller 214. The controller 214 provides the control inputs to the drive circuit 212 to operate the controllably conductive device 210 (i.e., to provide voltage from the AC power source 102 to the lighting load 204) at predetermined times relative to the zero-crossing points of the AC waveform. For example, if the controllably conductive device 210 is a relay, the controller 214 may render the relay conductive near the zero-crossing points of the AC waveform in order to minimize any possible arcing between the contacts of the relay.

The load control device 120 further comprises a communication circuit such as an RF transceiver 222 which operates in conjunction with the antenna 124 for receipt and transmission of the RF signals 106. Alternatively, the communication circuit may comprise an RF receiver that operates in conjunction with the antenna 124 for receipt of the RF signals 106. The RF transceiver 222 is powered by the power supply 218 which derives the DC supply voltage $V_{CC}$ from the AC power source 102. Thus, the RF transceiver 222 is coupled to the AC power source 102 through the power supply 218. The antenna 124 must be coupled to the RF transceiver 222 for receipt and transmission of the RF signals 106. However, because the antenna 124 extends outside the enclosure 152 via the opening 154 of the load control device 120, the antenna must also be electrically isolated from the AC power source 102. Thus, the RF transceiver 222 is not directly electrically coupled to the antenna 124, but rather, the RF transceiver is coupled to the antenna via a capacitive coupling 240. The capacitive coupling 240 further provides electrical isolation between the antenna 124 and the AC power source 102.

FIG. 4 is a simplified cross-sectional view of the PCB 300 of the load control device 120 which further illustrates the capacitive coupling 240 between the antenna 124 and the RF transceiver 222. The PCB 300 is a 4-layer PCB including outer layers 320, 326 and inner layers 322 and 324. Each layer 320-326 is separated from an adjacent layer by a non-conductive layer 330 (i.e., a PCB substrate portion) which may, for example, be made of an FR-4 material. For example, the outer layer 320 is separated from inner layer 322 by the non-conductive layer 330. Portions of each layer 320-326 are plated with conductive material (e.g., copper) to form traces which electrically couple various electrical components. The RF transceiver 222 is electrically coupled to a trace 304A on the outer layer 320 of the PCB 300. For example, the RF transceiver 222 may be a surface mounted component which is operable to be soldered to the trace 304A on the outer layer 320 of the PCB 300. The trace 304A is also coupled to a PCB via 302A (i.e., a conductive plated through-hole), and the via is formed in an opening (typically, a circular opening) that extends through the layers 320-326 of the PCB 300 wherein the perimeter of the opening is also plated with the conductive material. The via 302A is further coupled to a trace 306A on the inner layer 322. Thus, the RF transceiver 222, the via 302A and the traces 304A, 306A are all directly electrically coupled together.

The antenna 124 is electrically coupled a PCB via 302B. For example, the diameter of the PCB via 302B may be large enough to accommodate one end of wire which forms the antenna 124 such that the antenna can be inserted into the via 302B and soldered into place. The via 302B is further coupled to a trace 306B on the inner layer 322 and a trace 304B on the outer layer 326. Thus, the antenna 124, the via 302B, and the traces 306B, 304B are all directly electrically coupled together. However, the antenna 124, the via 302B, and the traces 306B, 304B, are not directly electrically coupled to (i.e., are not in direct electrical contact with) the transceiver 222, the via 302A and the traces 304A, 306A. Thus, electrical isolation is provided between the antenna 124 (which extends outside of the enclosure 152) and the RF transceiver 222 (which is coupled to the AC power source 102 via the power supply 218).

However, because the traces 304A, 304B, 306A, and 306B are positioned adjacent and parallel to one another (i.e., stacked) through the layers 320-326 of the PCB 300 and are dimensioned accordingly, capacitive coupling 240 is formed between the antenna 124 and the RF transceiver 222. In particular, the substrate portion of the non-conductive layers 330 forms the dielectric of the capacitive coupling 240. The area of each trace 304A, 304B, 306A, and 306B may be sized, for example, at 0.250 inches wide by 0.250 inches long (i.e., 0.0625 square inches). The thickness of the traces 304A, 304B on the outer layers 320, 326 of the PCB 300 may be, for example, approximately 0.0007 inches. The thickness of the traces 306A, 306B on the inners layers 322, 324 may be, for example, approximately 0.0014 inches, and the thickness of the non-conductive layers 330 may range between approximately 0.0225 and 0.014 inches. Given the illustrative dimensions provided above, the capacitance of the capacitive coupling 240 may be approximately 25 picofarads (pF). However, the capacitance of the capacitive coupling 240 may range between, for example, 10-100 picofarads.

Thus, the antenna 124, the RF transceiver 222, and the capacitive coupling 240 together form a message receiving structure. When the RF signals 106 are received by the antenna 124, they are conducted to the trace 306B of inner layer 322 and the trace 304B of the outer layer 324 and are then capacitively coupled to the adjacent traces 304A and 306A through the non-conductive layers 330 such that the RF signal can be also received and subsequently processed by the RF transceiver 222. Similarly, when the load control device 120 must transmit a digital message via the RF transceiver 222, the RF signals 106 are conducted to the traces 306A and 304A and are then capacitively coupled to the adjacent traces 306B and 306A such that the RF signals are transmitted by the antenna 124.

According to an alternative embodiment, the capacitive coupling 240 may be formed by using as few as two layers of a printed circuit board having multiple layers (i.e., any number greater than one). For example, the printed circuit board may comprise a 4 layer printed circuit board wherein only two layers are used to form the capacitive coupling. Alternatively, a 2-layer printed circuit board may be used, wherein only the outer layers of the printed circuit board are used to form the capacitive coupling. For example, if a 2-layer printed circuit board is used the area of the traces used to form the capacitive coupling may be approximately 0.134 square inches. Further, the area of each trace that forms the capacitive coupling need not be a perfect square, and can be a non-uniform shape. In addition, while the present invention has been described with reference to the load control device 120 which comprises RF transceiver 222, the concepts of the present invention could be applied to a load control device having only an RF receiver or only an RF transmitter.

While the present invention has been described with reference to the load control device 120 for controlling the amount of power delivered to a connected lighting load, the concepts of the present invention could be applied to load control systems comprising other types of load control devices, such as, for example, a dimmer switch for adjusting the intensity of a lighting load, a fan-speed control for controlling a fan motor, an electronic dimming ballast for a fluorescent load, and a driver for a light-emitting diode (LED) light source. In addition, according to an alternative embodiment, the load control device 120 may be further operable to communicate on a wired communication link as well as the wireless communication link. For example, the load control device 120 may be coupled to other load control devices via the wired communication link such that the load control device 120 can transmit and receive digital messages from other load control devices.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A load control device operable to control the amount of power delivered to a load from an AC power source, the load control device comprising:
   a printed circuit board comprising a first layer comprising a first trace and a second layer comprising a second trace, the first and second traces being positioned parallel to one another;
   an enclosure containing the printed circuit board;
   a communication circuit electrically coupled to the first trace; and
   a wire monopole antenna electrically coupled to the second trace, the wire monopole antenna being adjustable into one or more positions, a first position of the one or more positions including the wire monopole antenna extending freely from the enclosure, the first position increasing a range of reception of the wire monopole antenna relative to the wire monopole antenna not extending freely from the enclosure;
   wherein the first trace is oriented to form a capacitive coupling with respect to the second trace, such that the antenna is capacitively coupled to the communication circuit.

2. The load control device of claim 1, wherein the capacitive coupling provides electrical isolation between the antenna and the AC power source.

3. The load control device of claim 2, further comprising:
   a power supply operable to provide a DC supply voltage for powering the communication circuit, the DC supply voltage derived from the AC power source;
   wherein the capacitive coupling provides electrical isolation between the antenna and the power supply.

4. The load control device of claim 3, wherein the communication circuit comprises at least a radio frequency receiver.

5. The load control device of claim 2, further comprising:
   a controllably conductive device operable to control the amount of AC power delivered to the load; wherein the antenna is electrically isolated from the controllably conductive device.

6. The load control device of claim 2, wherein the capacitive coupling has a capacitance of between approximately 10 picofarads and 100 picofarads.

7. The load control device of claim 2, wherein the printed circuit board further comprises a non-conductive layer positioned between the traces of the first and second layers of the printed circuit board.

8. The load control device of claim 7, wherein the printed circuit board comprises:
   a third layer comprising a third trace electrically coupled to the first trace; and
   a fourth layer comprising a fourth trace electrically coupled to the second trace;
   wherein the first, second, third, and fourth traces are positioned parallel to one another and the second trace is positioned between the first and third traces, and the third trace is positioned between the second and fourth trace such that the first and third traces are capacitively coupled to the second and fourth traces.

9. The load control device of claim 8, wherein the first, second, third and fourth traces of the printed circuit board each comprise an area of approximately 0.0625 square inches.

10. The load control device of claim 8, wherein the thickness of the first, second, third and fourth traces is between approximately 0.0007 and 0.0014 inches.

11. The load control device of claim 10, wherein the distance between each of the first, second, third, and fourth traces is between approximately 0.0225 and 0.014 inches.

12. The load control device of claim 7, wherein the printed circuit board is a 2-layer printed circuit board wherein the first layer and the second layer form the outer layers of the printed circuit board.

13. The load control device of claim 7, wherein the printed circuit board is a 4-layer printed circuit board.

14. The load control device of claim 1, wherein the enclosure further comprises a mechanical channel adapted to receive the antenna in a second position of the one or more positions.

15. The load control device of claim 14, wherein the antenna is removable from the mechanical channel of the enclosure such that the antenna extends freely from the enclosure in the first position.

16. A message receiving structure for use in a load control device, the load control device having an enclosure containing the printed circuit board, the message receiving structure comprising:
   a printed circuit board having a first layer comprising a first trace, a second layer comprising a second trace, a third layer comprising a third trace, and a fourth layer comprising a fourth trace, the traces being positioned parallel to one another and the second trace being positioned between the first and third traces, and the third trace being positioned between the second and fourth traces;
   a communication circuit electrically coupled to the first and third traces; and
   a wire monopole antenna electrically coupled to the second and fourth traces; wherein the first and third traces are oriented to form a capacitive coupling with respect to the second and fourth traces, such that the antenna is capacitively coupled to the communication circuit;
   wherein the wire monopole antenna is adjustable into one or more positions, a first position of the one or more positions includes the wire monopole antenna extending freely from the enclosure, and the first position increases a range of reception of the wire monopole antenna relative to the wire monopole antenna not extending freely from the enclosure.

17. The message receiving structure of claim 16, wherein the load control device is adapted to be coupled to an AC power source, and the capacitive coupling provides electrical isolation between the antenna and the AC power source.

18. The message receiving structure of claim 16, wherein the capacitive coupling has a capacitance of between approximately 10 picofarads and 100 picofarads.

\* \* \* \* \*